US008017937B2

(12) United States Patent
Houbertz-Krauss et al.

(10) Patent No.: US 8,017,937 B2
(45) Date of Patent: Sep. 13, 2011

(54) SEMI-CONDUCTOR COMPONENT, COMPONENT, METHOD FOR THE PRODUCTION THEREOF AND USE OF INORGANIC-ORGANIC HYBRID POLYMERS FOR PRODUCNG SEMI-CONDUCTOR COMPONENTS

(75) Inventors: Ruth Houbertz-Krauss, Werneck (DE); Angelika Schmitt, Wuerzburg (DE); Gerhard Domann, Wuerzburg (DE); Michael Popall, Wuerzburg (DE); Barbara Stadlober, Graz (AT); Ursula Haas, Gleisdorf (AT); Anja Haase, Graz (AT)

(73) Assignees: Fraunhofer-Gesellschaft zur Foerderung der Angewandten Forschung E.V., Munich (DE); Joanneum Research ForSchungsgesellschaft MBH, Graz (AT)

( * ) Notice: Subject to any disclaimer, the term of this patent is extended or adjusted under 35 U.S.C. 154(b) by 945 days.

(21) Appl. No.: 11/665,740

(22) PCT Filed: Oct. 21, 2005

(86) PCT No.: PCT/EP2005/011362
§ 371 (c)(1),
(2), (4) Date: Dec. 10, 2007

(87) PCT Pub. No.: WO2006/045562
PCT Pub. Date: May 4, 2006

(65) Prior Publication Data
US 2008/0073642 A1    Mar. 27, 2008

(30) Foreign Application Priority Data
Oct. 22, 2004   (DE) .................. 10 2004 051 616

(51) Int. Cl.
*H01L 51/00* (2006.01)
(52) U.S. Cl. ..... 257/40; 257/642; 257/759; 257/E51.01; 438/82; 438/99
(58) Field of Classification Search .................. 257/40, 257/642, 759, E39.07, E51.01, E51.005, 257/E51.015, E51.017; 438/82, 99
See application file for complete search history.

(56) References Cited

U.S. PATENT DOCUMENTS
6,870,181 B2 *   3/2005   Zhang et al. .................. 257/40
(Continued)

FOREIGN PATENT DOCUMENTS
WO   WO 03/031499 A   4/2003

OTHER PUBLICATIONS
Houbertz R et al: "Inorganic-organic hybrid materials for polymer electronic applications" Mater Res Soc Symp Proc; Materials Research Society Symposium—Proceedings 2003, Bd. 769, Apr. 21, 2003,-Apr. 25, 2003 Seiten 239-244, XP002359939 das ganze Dokument.

(Continued)

*Primary Examiner* — Thinh Nguyen
(74) *Attorney, Agent, or Firm* — Millen, White, Zelano & Branigan, P.C.

(57) ABSTRACT

The invention relates to a semiconductor component having a metal-insulator structure (MIS) which contains as basic components a substrate, a layer made of an organic semiconductor material and a dielectric layer as insulator. The substrate and/or the dielectric layer made of an inorganic-organic hybrid polymer is chosen from these basic components. In addition, the invention relates to a method for the production of semiconductor components of this type and also to the use of inorganic-organic hybrid polymers for the production of semiconductor components.

28 Claims, 10 Drawing Sheets

U.S. PATENT DOCUMENTS

2004/0242830 A1 12/2004 Frohlich et al.

OTHER PUBLICATIONS

Houbertz R et al: "Inorganic-organic hybrid materials (ORMOCER (R)s) for multilayer technology-passivation and dielectric behavior" Electronic, Optical and Optoelectronic Polymers and Oligomers. Symposium (Mater. Res. Soc. Symposium Proceedings vol. 665) Mater. Res. Soc Warrendale, PA, USA, 2001, Seiten 321-326, XP002359940 ISBN: 1-55899-601-X des ganze Dokument.

Popall M et al: "ORMOCER ( R) s-inorganic-organic hybrid materials for e/o-interconnetion-technology" Molecular Crystals and Liquid Crystals Gordon & Breach Switzerland, Bd. 354, 2000, Seiten 711-730, XP008057603 ISSN: 1058-725X des ganze Dokument.

Haas U et al: "Growth process control of pentacene thin films and its application in full organic thin film transistors" Polymers and Adhesives in Microelectronics and Photonics, 2004. Polytronic 2004. $4^{TH}$ IEEE International Conference on Portland, OR, USA Sep. 12-15, 2004, Piscataway, NJ, USA, IEEE, Sep. 12, 2004, Seiten 219-224, XP010775950 ISBN: 0-7803-8744-9 das ganze Dokument.

Dabek A et al: "Evaluation of ORMOCERS for Microelectronics Applications" European Microelectronics Conference, 1997, Seiten 125-132, XP009026117 das ganze Dokument.

Robertsson M E et al: "O/E-MCM packaging with new, patternable dielectric and optical materials" Electronic Components & Technology Conference, 1998.. $48^{TH}$ IEEE Seattle, WA, USA May 25-28, 1998, New York, NY, USA, IEEE, US, May 25, 1998, Seiten 1413-1421, XP010283789 ISBN: 0-7803-4526-6 das ganze Dokument.

Frohlich L et al: "Inorganic-organic hybrid polymers as photo-patternable dielectrics for multilayer microwave circuits" Organic/Inorganic Hybrid Materials—2002, Symposium (Materials Research Society Symposium Proceedings vol. 726) Mater. Res. Soc Warrendale, PA, USA, 2002, Seiten 349-354, XP002359941 das ganze Dokument.

\* cited by examiner

SEMI-CONDUCTOR COMPONENT, COMPONENT, METHOD FOR THE PRODUCTION THEREOF AND USE OF INORGANIC-ORGANIC HYBRID POLYMERS FOR PRODUCNG SEMI-CONDUCTOR COMPONENTS

The invention relates to a semiconductor component having a metal-insulator structure (MIS) which contains as basic components a substrate, a layer made of an organic semiconductor material and a dielectric layer as insulator. The substrate and/or the dielectric layer made of an inorganic-organic hybrid polymer is chosen from these basic components. In addition, the invention relates to a method for the production of semiconductor components of this type and also to the use of inorganic-organic hybrid polymers for the production of semiconductor components.

Since the conventional microelectronics industry has reached a point at which the constant increase in integration density which is motivated by the dynamics of the information technology market demands ever more complex technologies and hence involves exponentially increasing production costs, electronics based on economical organic and synthetic materials is becoming more and more important wherever direct integration of electronics with consumer goods is required. However cost reduction is not the only marketing strategy in the field of polymer electronics. Hence electronic, optical and sensor components could be combined with these flexible and partly biocompatible materials in a manner which is not possible at all with silicon or only with considerable cost expenditure.

The performance of organic components is still far below that of silicon. Even in the best organic semiconductor, pentacene, the highest value reported to date for the charge carrier mobility is still three orders of magnitude less than that for silicon.

Apart from these physical restrictions, there have been, in the last decade, impressive improvements in the performance of organic components which make use of organic electronics more and more feasible in the medium term in a series of economical, large-area applications, such as for example actively-controlled flat screens, smart cards, electronic paper, RF-ID labels and large-area sensors.

Besides the obvious cost argument, organic electronics relative to inorganic electronics has the advantage above all of low process temperatures ($\leq 200°$ C.), as a result of which electronic circuits can be integrated on large-area, cheap, flexible, light, durable and even biological substrates, which of course opens up a wide field of new applications. As a result, electronic circuits can be integrated for the first time with all materials of everyday life ("ambient intelligence") and hence make the vision of an electronically supported everyday life a reality. One example of such visionary products is intelligent colour and temperature sensors, electronic wallpaper and scrollable displays which are physically integrated. In the long term, the production of simple organic electronic components will be implemented in cost-effective roll-to-roll or sheet-to-sheet methods.

The basic element of organic electronics is the organic field effect transistor. As already mentioned, the aromatic, low molecular hydrocarbon pentacene is an excellent candidate for the active semiconductor since it forms highly ordered, polycrystalline, thin films (Stadlober, V. Satzinger, H. Maresch, D. Somitsch, A. Haase, H. Pichler, W. Rom and G. Jakopic (2003), Structural and Electrical Properties of Polymorphic Pentacene Thin Films. Proceedings of SPIE, vol. 5217, Organic Field Effect Transistors II, ed. C. C: Dimitrakopoulos and A. Dodabalapur (SPIE, Bellingham, Wash., 2003)), has the highest charge carrier mobility of all organic semiconductors and is substantially more stable in the atmosphere than most polymer semiconductors, such as for example polythiophene. During the last five years, the improvement in the electrical characteristics of field effect transistors based on pentacene has been the focus of interest of a multiplicity of polymer physics/chemistry groups. A great deal of energy has been devoted to optimising the production process and the design, to improving conventional inorganic dielectrics, to varying organic dielectrics, to optimising the interfaces and the contact characteristics. Furthermore, the interest in understanding and exact monitoring of the growth process of the active semiconductor layer is increasing.

Inorganic dielectrics, such as for example $SiO_2$ or $SiN_x$ and $Al_2O_3$ provide pentacene OFETs with reasonable and readily reproducible characteristic lines although, during the production process, often substantially higher temperature are used than is necessary for organic electronics on flexible substrates. In the case of organic gate dielectrics, there are a few promising candidates. The quality of most of these layers is however very variable, which can be attributed to local variations in the layer thickness and the dielectric constant, in the existence of mobile ions, in the large number of traps, the formation of dipoles at the interface, the low stability relative to high electrical fields, the high leakage currents and the low resistance relative to chemicals which are used in photolithographic processes. In order to scale the technology to smaller dimensions, the existence of an ultrathin (<200 nm), reliable, organic insulation layer would be in addition unavoidable. A further property which would be advantageous for lowering the production costs and maintaining the quality of the dielectric interface resides in the direct structurability of the dielectric layer in order to be able to construct contact holes.

Very little attention has been paid to date to the interplay between pentacene and the dielectric situated thereunder although the interface between the polycrystalline semiconductor and amorphous dielectric is crucial for the charge carrier transport (mobility) and the formation of traps and dipoles. For organic dielectrics there is no systematic examination of the conditions for perfect engineering of this interface.

The film growth of an oligomer semiconductor, such as e.g. pentacene, from the vapour phase is influenced by many parameters. Apart from the deposition rate and the substrate temperature, also the material of the substrate, its roughness, its surface chemistry, the cleanliness and the pretreatment play a part. It has been able to be shown that the growth of pentacene on well-ordered and pretreated Si surfaces by a DLA (diffusion-limited aggregation) process and on $SiO_2$ surfaces cleaned with $O_2$ plasma can be described by standard nucleation theory based on thermodynamic rate equations. This means that, as a function of the growth conditions and the quality of the substrate, the nucleation of pentacene islands follows a predefined and correlated course. Highly ordered, polycrystalline pentacene films with large dendritic particles and few particle boundaries which impede transport require exceptionally low deposition rates, slightly increased substrate temperatures and a very smooth dielectric substrate with an insignificant number of reactive bonds. The choice of substrate material however influences not only the morphology and homogeneity of the films and the particle sizes but also the formation of different pentacene phases (polymorphs). When the molecules reach the surface, they arrange themselves in the ideal case virtually perpendicularly to the substrate surface and parallel to each other. For such an arrangement, the overlapping of the π-electron orbitals is maximum and it is assumed that the charge carrier mobilities for the transport are highest parallel to the surface. As a function of the substrate material, of the temperature and of the film thickness, four different phases are formed however which differ only in the angle which the molecular axis forms with the substrate surface. Observed from a geometrical point of view, small differences consequently result in the overlapping of the π-electron orbitals. The phase with the greatest overlap is termed thin film phase and is at the same time the one with the smallest angle of the molecular axis to the normal. Its c-axis length is 15.5 Å. The second phase which is frequently observed in polycrystalline films is the volume phase which has a c-axis length of 14.5 Å. The two remaining phases are the monocrystalline phase which is observed only in ultrathick films or in monocrystals and a phase which can be found on less common substrates (e.g. Kapton). As a result of the small differences in the orbital overlap, small differences are expected in the transport properties. It is thus assumed that the volume phase with its larger angle relative to the surface and hence smaller orbital overlap also has a lower intrinsic charge carrier mobility.

Several organic OFETs using the most varied of organic and inorganic dielectrical materials have been described previously. WO 03/038921 A1 describes an insulator for an organic field effect component, such as e.g. an organic field effect transistor (OFET) and/or an organic condenser. Organic co-polymers and mixtures thereof and also base polymers which are soluble in non-polar hydrocarbons are thereby essentially used. In WO 02/065557 A1, the structure of such an OFET is described inter alia using the insulator materials described in WO 03/038921 A1. EP 0 537 240 B1 describes a thin layer transistor with an MIS structure in which semiconductor and insulator are organic materials. The insulator layer has at least a permittivity of 6 and is either a polyvinyl alcohol or a cyanoethylpullulan. In J. A. Rogers, Z. Bao and A. Dodabalapur, Organic smart pixels and complementary inverter circuits formed on plastic substrates by casting and rubber stamping, IEEE Electron device lett., vol. 21, no. 3, 2000, the use of polyimide as organic dielectric for the production of an organic light diode or monolithically integrated transistors is furthermore described. In U.S. Pat. No. 6,617,609 B2, a siloxane polymer layer is described which is used as intermediate layer on a gate dielectric and the organic semiconductor and also the production of an organic thin film transistor (OTFT) using such an intermediate layer. U.S. Pat. No. 6,187,427 describes a three-phase composite, namely inorganic particles of less than 1 μm diameter in an organic, porous matrix which is used as intermediate layer dielectric for the production of integrated circuits (ICs). The pores thereby serve for reduction of the permittivity to values of $\in_r < 3$ (at $\geq 1$ MHz).

It was therefore the object of the present invention to provide semiconductor components which can be produced easily and which overcome the described disadvantages of the prior art.

This object is achieved by the semiconductor component having the features of claim 1, the method for the production thereof having the features of claim 17 and the use of inorganic-organic hybrid polymers for the production of semiconductor components according to claim 19. The further dependent claims reveal advantageous developments.

According to the invention a semiconductor component having a metal-insulator structure (MIS) is provided, which contains a substrate, a layer made of an organic semiconductor material and a dielectric layer as insulator. The invention is characterised in that the substrate and/or the dielectric comprises an inorganic-organic hybrid polymer.

Inorganic-organic hybrid polymers, such as e.g. the ormocers developed at the Fraunhofer ISC, can be adapted to different applications with respect to their material properties. Silicon-based varnishes, produced by means of sol-gel processing, and the use thereof as substrate coatings are known from WO 93/25605 and EP 0 644 908. The disclosure content of these publications is incorporated herewith by reference in the present disclosure. The materials described there are thereby suitable in particular for use under very rough environmental conditions, i.e. in particular as passivation and encapsulation materials against moisture. In the field of passivation of (micro-) electronic components, such as e.g. SMT (surface-mount technology components) or as a structured layer in multiple layer constructions, hybrid polymers were used exclusively as sealing encapsulation layer (structurable barrier layers against water vapour/moisture). The water vapour transmission rates (WVTR) of the hybrid polymers can be controlled via the content of inorganic component and also the organic functionalities. With passivating, structurable hybrid polymers, already WVTR values of approx. 1.3 g/m²d (relative to 100 μm layer thickness) were achieved for these. The breakdown strengths (DC) of these hybrid polymers are in the range of 100 to 300 V/μm.

Although these materials have already shown high breakdown strength, their permittivities to date being in the range of 3 to 4 and good barrier properties against moisture being able to be achieved, for example for microelectronic, nanoelectronic or polymer-electronic applications, materials with very high ($\in_r > 4$) or very low permittivity ($\in_r < 3$) are required over a broad frequency range, which materials can be applied by a multiplicity of technological methods and in layer thicknesses of significantly below 1 μm, preferably in the range 100 nm or less, free of pinholes. Furthermore, suitability as a gate dielectric and substrate for organic semiconductors or small molecules is desirable in particular for polymer-electronics since as a result process steps, such as e.g. the complete processing of an intermediate layer, would be dispensed with. As a result, the processing times can be reduced and also the costs can be further reduced.

The combination of an organic-inorganic hybrid material as gate dielectric with an active polycrystalline semiconducting layer forms the central core of an MIS structure or of an organic thin layer condenser and is exceptional. The properties of the semiconducting layer can be specifically adjusted by changing the composition, the synthesis and the processing of the inorganic-organic passivating, structurable dielectric and hence by the quality of the interface.

The chemical resistance of the gate dielectric and of substrate relative to short reactive etching (gas phase, e.g. $O_2$), alcohols, ketones, acetates or other widely used chemicals for structuring in the semiconductor industry (e.g. UV lithography) is outstanding and, in comparison with organic dielectrics, such as are used for example in polymer-electronics, is without equal. Consequently, also the quality of the interface is maintained during the entire process and necessary steps to protect the dielectric during processing are dispensed with. Hence this also leads to a cost reduction. At the same time, the material can be used as structurable passivation relative to environmental influences, as a result of which a multiplicity of applications and components becomes possible. The functional combination of an inorganic-organic dielectric and passivating material with an organically semiconducting material within a high-quality organic thin layer transistor provides an extremely promising candidate for logic components for economical organic electronics.

Preferably both the substrate and the dielectric later are formed from the inorganic-organic hybrid polymer. The substrate and/or the dielectric layer can thereby have a layer thickness of preferably 1 nm to 1 μm and particularly preferred of 1 nm to 100 nm.

The semiconductor component according to the invention can preferably have in addition a carrier structure on which the substrate is deposited as a layer. The carrier structure can thereby be formed also from an inorganic-organic hybrid polymer. It is however also possible that the carrier structure is selected from the group comprising metals, semiconductors, substrates with oxidic surfaces, glasses, films, printed circuit boards (PCB), polymers, heterostructures, paper, textiles and/or composites.

Preferably the inorganic-organic hybrid polymer can be obtained by a method having the following steps:
(i) precondensation of:
a) 1 to 10% by mol of at least one silicon compound of formula I:

$$MR_4 \quad (I)$$

M being selected from the group silicon, zirconium, aluminium and titanium and R being a halogen, hydroxy, alkoxy, acyloxy or a chelate ligand;
b) 20 to 94% by mol of at least one organic silane of formula II:

$$R'''_m(YR''')_n SiX_{(4-m-n)} \quad (II)$$

R" being alkyl, aryl, alkylaryl, arylalkyl,
R'" being alkylene, alkenylene, arylene, alkylarylene, arylalkylene, alkenylarylene, arylalkenylene,
R" and R'" being able to be interrupted by oxygen, sulphur or —NH—,
X being hydrogen, halogen, hydroxy, alkoxy, acyloxy, —NR$_2$', R' being equal to H or alkyl,
Y being a polymerisable group,
m being a whole number from 0 to 2,
n being a whole number from 1 to 3,
m+n extending from 1 to 3 and
c) 5 to 30% by mol of at least one organic silane of formula III

$$R''_p SiX_{4-p} \quad (III)$$

R' and X having the above meaning and p being equal to 1, 2 or 3 and if necessary
d) 0 to 10% by mol of at least one low volatile metal oxide, soluble in the reaction medium, of an element of groups Ia to Va or Vb or of at least one compound, soluble in the reaction medium, of one of these elements which form a low volatile oxide;
without external addition of water, if necessary in the presence of an organic solvent at a temperature between 0 and 90° C. during a time period between 0.5 and 48 hours and
(ii) hydrolysis condensation of the precondensate of step (i) with the stoichiometric quantity of water, at a temperature between 0 and 100° C. during a time period between 1 and 72 hours.

For microelectronic, nanoelectronic, or polymer-electronic applications, materials with very high or very low permittivity over a wide frequency range are required. Preferably, the inorganic-organic hybrid polymer has therefore a permittivity of $\in_r<3$. In a further embodiment, the inorganic-organic hybrid polymer preferably has a permittivity of $\in_r>4$.

The water vapour transmission rates (WVTR) of the hybrid polymers can be controlled via the content of inorganic component and also the organic functionalities. Preferably the inorganic-organic hybrid polymer has a water vapour transmission rate (WVTR) of $10^{-3}$ to 30 g/m²d, particularly preferred of 0.1 to 3 g/m²d. These rates relate respectively to a layer thickness of 100 μm.

The inorganic-organic hybrid polymer preferably has a breakdown strength in the range of 50 to 400 V/μm.

In addition, the inorganic-organic hybrid polymer is preferably halogen-free and transparent. It is also preferred that it is resistant to the chemicals and solvents used in semiconductor electronics.

The semiconductor component according to the invention can preferably also have a source, a drain and a gate electrode.

The organic semiconductor material used for the semiconductor component can be chosen in an arbitrary manner, i.e. all the organic semiconductor materials known in prior art can be used. There are included here for example pentacene, poly(3-hexylthiophene) (P3HT), poly(p-phenylenevinylene) (PPV), polyamide (PA), polyacrylamide (PAA) and phthalocyanines.

The semiconductor components according to the invention are produced according to the method steps known from prior art, the application of the inorganic-organic hybrid polymers being effected by planar application methods, here in particular spin-coating, dip-coating, knife-coating or spraying, but also by structuring application methods, here in particular screen printing, tampon printing, ink-jet, offset printing and also gravure and letterpress printing.

According to the invention, the use of inorganic-organic hybrid polymers is also provided during the production of semiconductor components. This relates both to the use of the inorganic-organic hybrid polymers as substrates for the crystalline growth of small molecules. Equally however the use as substrate for the ordered application of organic semiconductor layers is included herewith. A further application field concerns the use of the mentioned hybrid polymers as dielectric layer.

The subject according to the invention is intended to be explained in more detail with reference to the subsequent Figures and examples without restricting said subject to the embodiments shown here.

Figure 1:
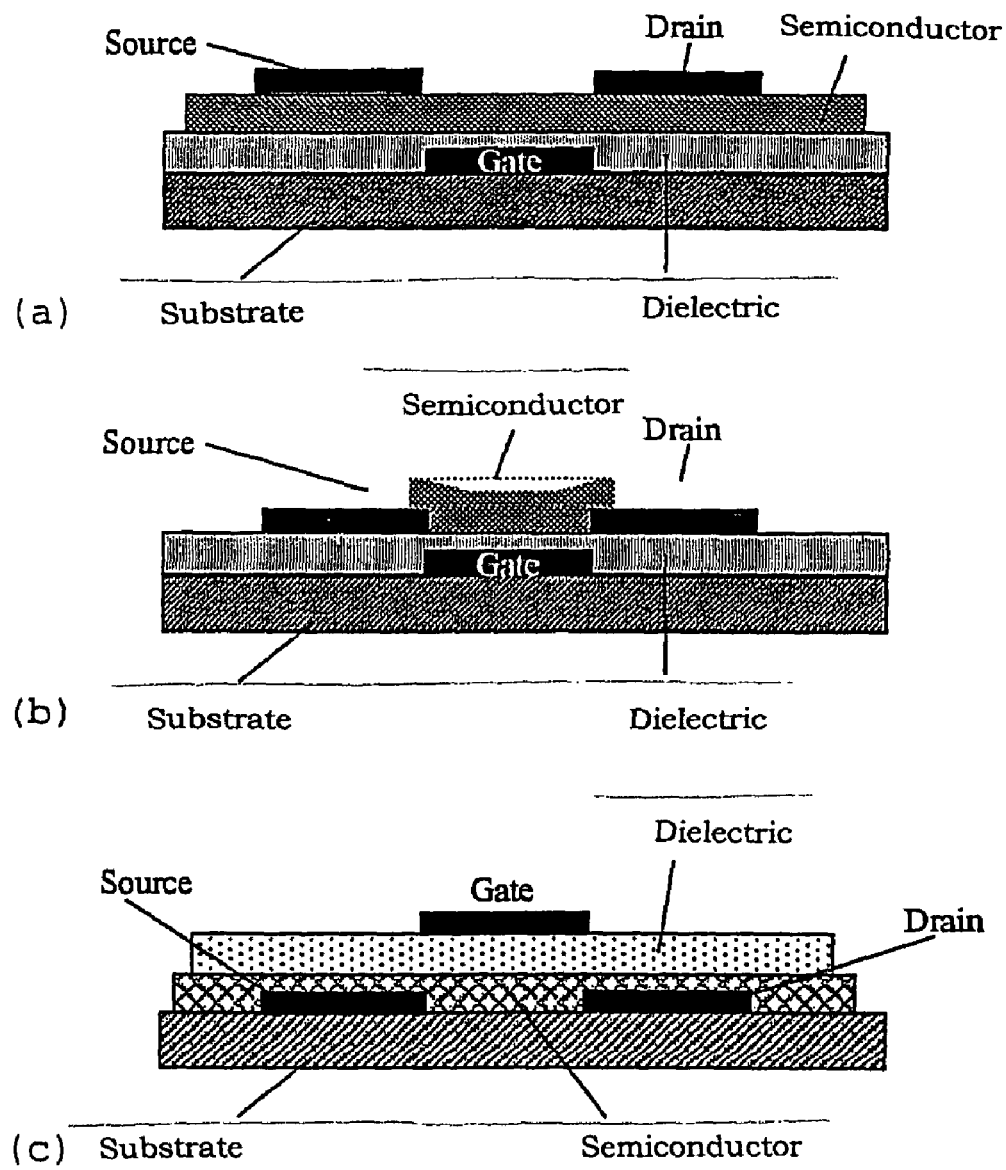
FIG. 1 shows three embodiments by way of example of semiconductor components according to the invention.

FIG. 1 shows typical layer sequences for various embodiments of the semiconductor components according to the invention. Thus FIG. 1a shows a source and drain electrode on the semiconductor layer, so-called top contact, FIG. 1b the arrangement of the source and drain electrode below the semiconductor, so-called bottom contact, and FIG. 1c the so-called top gate geometry in which the source and drain electrode are disposed below the semiconductor, whilst the gate electrode is situated on the dielectric disposed thereabove.

For the top and bottom contact, the semiconductor is applied directly onto the inorganic-organic, dielectric, passivating, structurable hybrid polymer. In order to form a well-defined interface, the oligomer growth must be adjusted very precisely for example in the case of small molecules. Thin layer transistors, which are based on oligomers or polymers, operate in accumulation. This means that the majority charge carriers, which are injected by the source electrode, are transported to the interface by a suitable bias. It was able to be shown that the thickness of the accumulation layer is only 1 to 2 oligomer monolayers. Hence the quality of the interface for unimpeded transport of the charge carriers and a high functional capacity resulting therefrom (high charge carrier mobility, low threshold voltage, high on-off ratio, no hysteresis of the TFT) is exceptionally important.

EXAMPLE 1

1.1 Resin Synthesis and Characteristics

The production of hybrid polymer system 1 (EL6) is described for a 0.4 mol formulation:

| | |
|---|---|
| 38.6% by mol | GLYMO (3-glycidyloxypropyltrimethoxysilane (Union Carbide)); |
| 38.6% by mol | MEMO (3-methacryloxypropyltrimethoxysilane (Fluka)); |
| 18.92% by mol | diphenylsilanediol (Fluka); |
| 3.86% by mol | $Zr(opr)_4$ (Zr(tetraisopropoxypropyltrimethoxysilane) (Fluka)); |
| 25% by stoich. | $H_2O$ |

In a 500 ml three-neck flask, which is equipped with an intensive cooler, a thermometer and a drop funnel, the individual monomers are weighed in the above sequence. The suspension is agitated magnetically and the temperature is lowered by approx. 1 to 2° C. The agitation at room temperature is ended after 18 h and the temperature is increased in the course of approx. 90 min to 70° C. The composition becomes clear and all the water is added to the mixture in one step. The temperature of the mixture is maintained at 70° C. When the varnish becomes clear after the addition of water (after approx. 20-30 min), the mixture is agitated for a further hour at a steady high temperature. After the reaction has ended, the varnish is cooled to room temperature.

1.2 Substrate Production (Technology) and Characteristics

The hybrid polymer system 1 (EL6) is diluted with propylacetate in the ratio 1:2 (EL6: solvent). 1% photostarter, relative to EL6, are added to the diluted system. Irgacure® 907 (Ciba-Geigy) is used as photostarter. The diluted EL6 is centrifuged onto a silicon wafer, which was cleaned in advance and silanised, at a rotational speed of 1500 rpm. Before exposure, the substrate is heated on a heating plate for 2 min at 110° C. and thereafter cooled again to room temperature. The light exposure is implemented on a mask aligner. Before light exposure, the exposure chamber is flushed for 2 min with nitrogen. The substrate is exposed for 30 s with a mercury lamp spectrum. The intensity is 20 mW/cm$^2$, measured at a wavelength of 405 nm. After the exposure, the substrate is heated again for 2 min on a heating plate at 150° C. and cooled to room temperature. If a mask is used during the exposure, the organically non-cross-linked EL6 can subsequently be developed for 30 s in a developer solution made of M-pentanone and isopropanol (1:1). The substrate is finally heated in an oven for three hours at 150° C.

With these process parameters, a layer thickness of approx. 500 nm is achieved. The surface energy of this layer can be determined as approx. 30 N/mm$^2$ according to Owens method with the help of a contact angle measurement (with water and ethyleneglycol).

1.3 Deposition of Small Molecules (Pentacene)

The starting material for the semiconductor layer is a fine-particulate powder from a commercial source which is pre-cleaned in a multistage sublimation and condensation process. The pre-cleaned powder is heated in a crucible or in a Knudsen cell until sublimation and the evaporating molecules condense on the non- or slightly heated surface of the substrate with the hybrid polymer system 1 (El6). The RMS roughness of El6 is 2.1 nm. In a precisely controlled deposition process, nominally 50 nm of the semiconductor are then applied very slowly at a deposition rate of approx. 0.1-0.3 nm/min. The substrate temperature is at 65° C., at a lower temperature (room temperature) the crystallites are somewhat smaller.

1.4 Characterisation of the Layers

Figure 2:
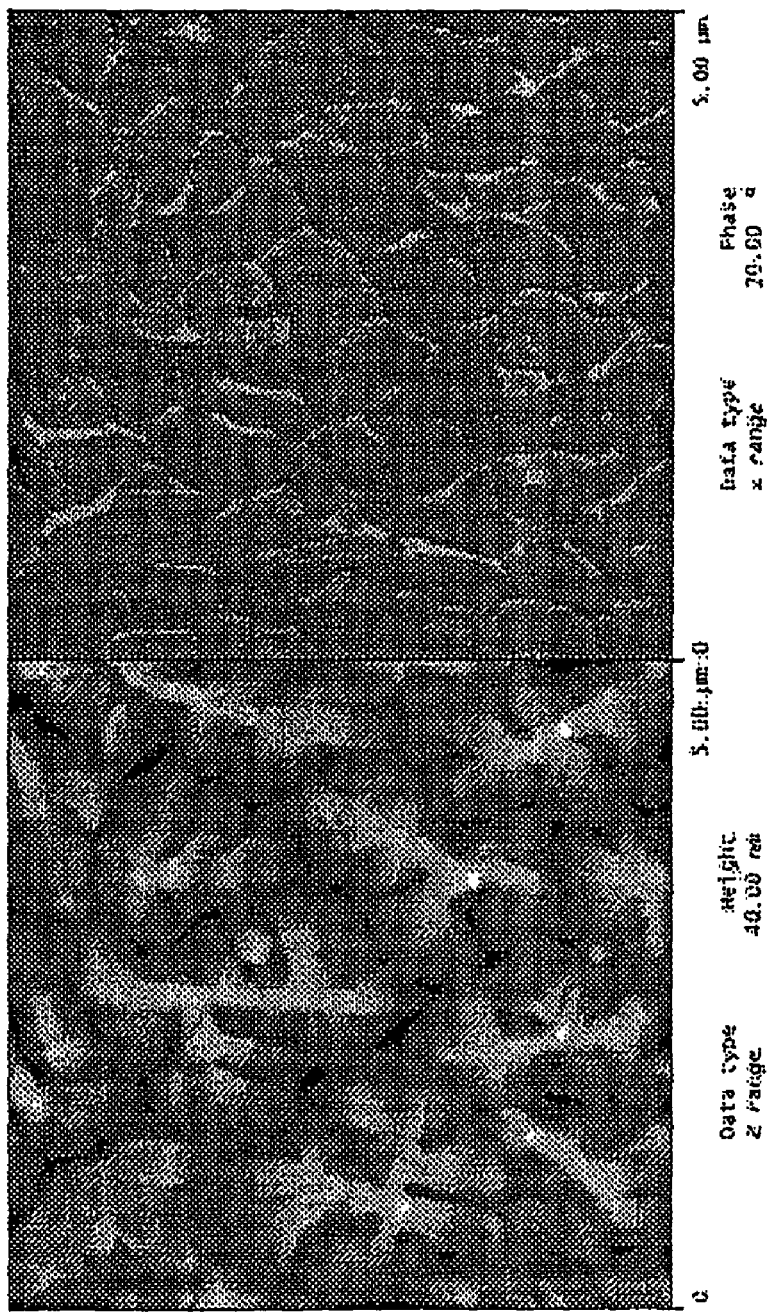
FIG. 2 shows a scanning force micrograph of the surface of the organic semiconductor pentacene in the case of a semiconductor component according to the invention according to example 1.

As mentioned already, the type of arrangement of the oligomer molecules on the substrate determines the structural, morphological and electrical properties of the thin semiconductor film. The morphology of the pentacene layers on the hybrid polymer system 1 is examined with a scanning power microscope, in FIG. 2 an example of a typical variation of the topography (left) and the modulus of elasticity (right) is represented.

In the contour image, island-like, strongly dendritic structures can be detected clearly. These can be assigned to individual pentacene crystallites, the size of the particles is between 2 and 3 µm and is uniformly distributed over the entire substrate. Several micrographs were taken per substrate which only differ minimally from each other with respect to particle size and shape. The shape of the crystallites and their size is typical of highly correlated film growth and of well-ordered, polycrystalline layers.

More precise evidence relating to the structure and the crystallinity of the films can be obtained with X-rays via powder diffractometry. The (001) reflections of the pentacene monocrystallites are thereby measured (l=1, 2, 3, . . . designates the order of the X-ray main maxima) and are assigned to corresponding lattice spacings. The better and more homogeneously ordered are the polycrystalline layers with respect to the substrate normal, the higher are the orders which can be observed. If proportions of different pentacene polymorphs are present, these can be differentiated by means of a different position of the (001) reflections since a different growth angle of the molecules is reflected primarily in an altered c-axis length of the elementary cell and hence in an altered lattice spacing.

Figure 3:
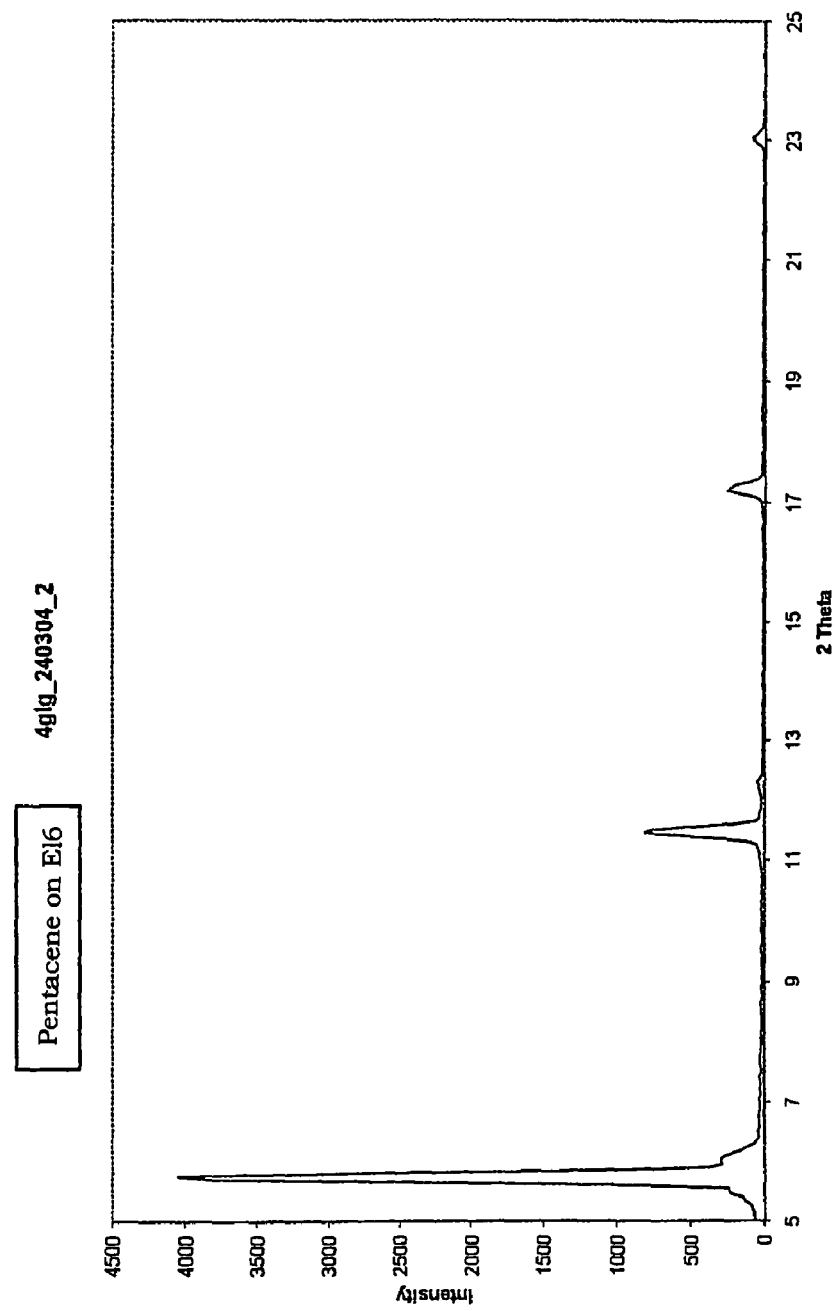
FIG. 3 shows a powder spectrum of a 50 nm pentacene layer according to the semiconductor component according to the invention of example 1.

The powder spectrum of a 50 nm pentacene film on the hybrid polymer system 1 (El6) shows mainly the thin film phase with a characteristic (001) reflection at 2Θ=5.7° (see FIG. 3). (001) reflections are clearly detectable up to the 4$^{th}$ order, also the main maxima are sufficiently sharp and intense so that a layer can be assumed which is well-ordered perpendicular to the surface even if azimuthally disordered, i.e. polycrystalline. Up to the second order, a very small proportion (5%) of the volume phase (2Θ=6.1°) can also be observed.

1.5 Production of TFTs and their Electrical Characterisation

From the silicon wafers coated with El6 and the condensed pentacene layer, a thin film transistor can be produced relatively easily in top contact configuration (FIG. 1a), in that Au is applied selectively via shadow masks by electron-beam or thermal evaporation and thus source and drain electrodes are produced. The wafer serves as gate electrode. El6 forms the gate dielectric.

The electrodes can be applied also below the pentacene layer (FIG. 1b, bottom contact) in a photolithographic or other structuring method and also other contact materials, such as for example conducting polymers (polyaniline) can be used. In a further sequence, in particular for the integration of different components, structuring of the gate electrode is also necessary. The reverse construction also offers application-specific advantages (FIG. 1c).

Figure 4:
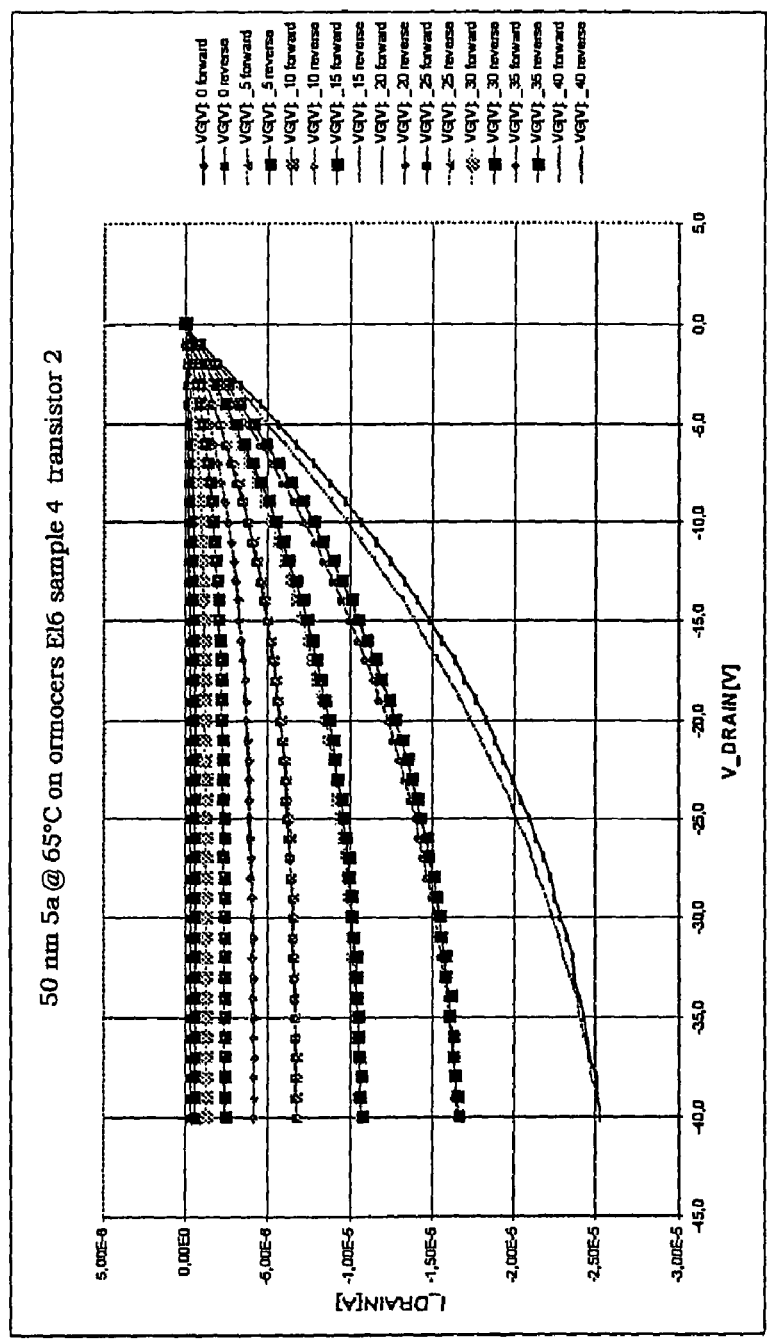
FIG. 4 shows a characteristic output line of a top contact semiconductor component according to example 1.

The electrical characterisation of the transistors with El6 as dielectric at the peak measuring place by means of a parameter analyser shows a pronounced field effect in the output characteristic line, i.e. clear controllability of the saturation level of the drain current with the gate voltage (FIG. 4). The course of the characteristic line is sufficiently good, there are observed saturation of the drain current which is satisfactory for organic dielectrics, a low leakage current (the characteristic lines all intersect at $V_{DS}$=0 V) which leads to the conclusion of sufficient density of the dielectric, and little hysteresis between the curves when rising (forward) and dropping (reverse) of the drain voltage. However a relatively high voltage must be applied in order to clear all the charge carriers out of the channel.

Figure 5:
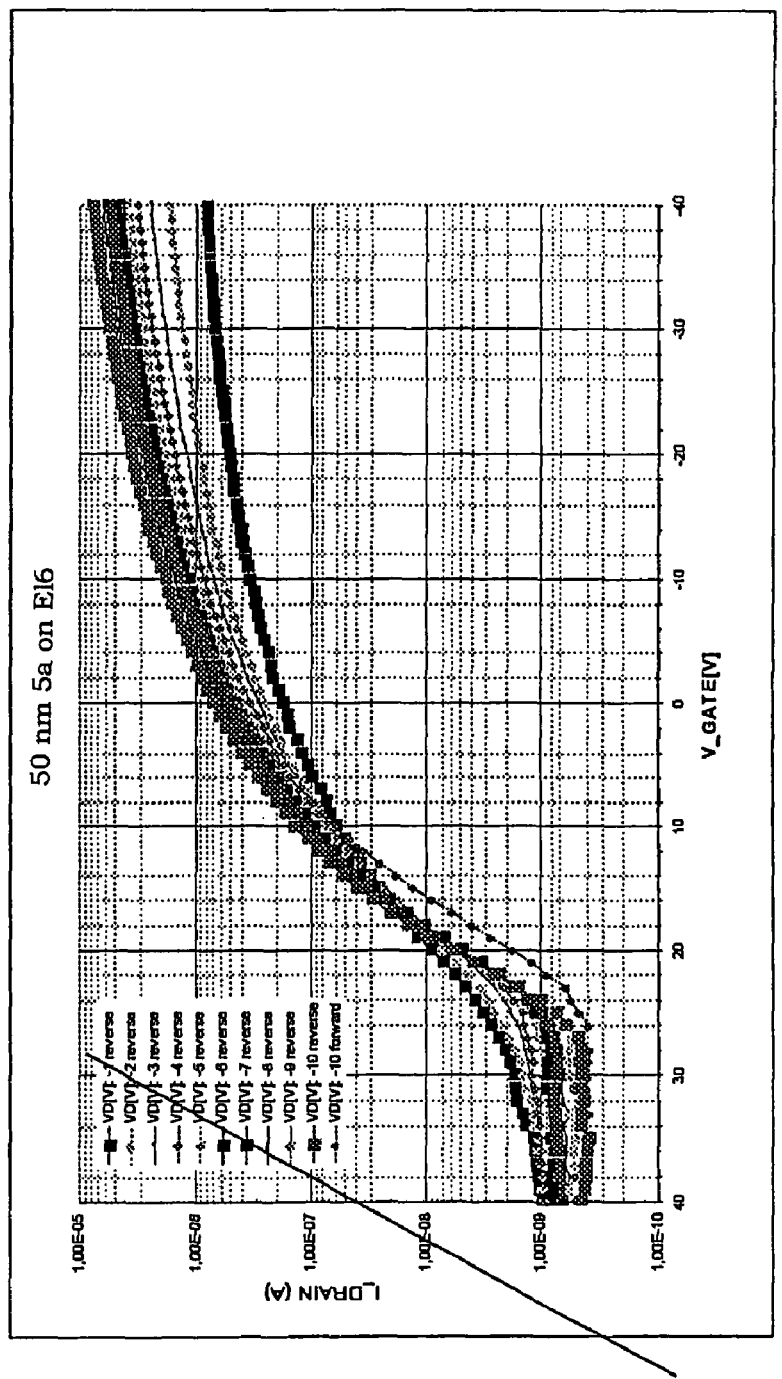
FIG. 5 shows a characteristic transfer line of a top contact semiconductor component according to example 1. The rise in the straight line corresponds here to the subthreshold slope after filling interface traps.
Figure 6:
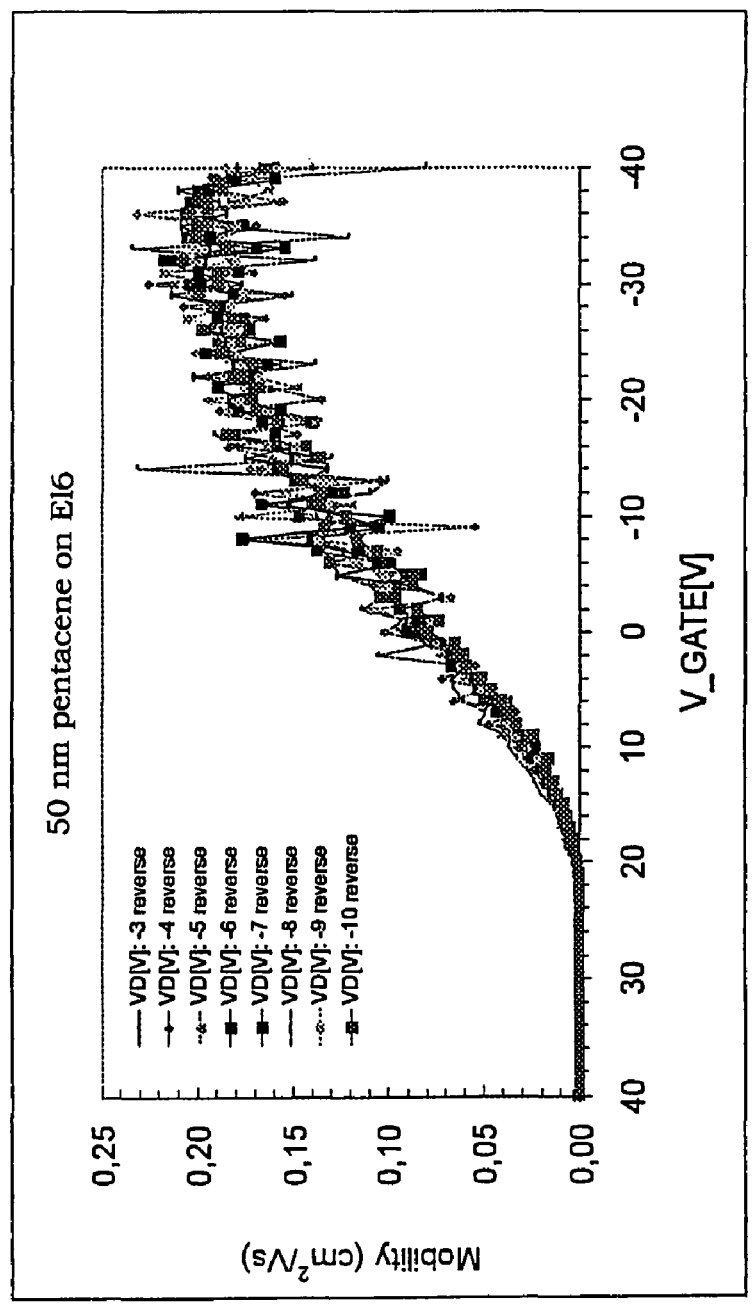
FIG. 6 illustrates a diagram which represents the gate voltage dependency of the charge carrier mobility of a top contact semiconductor component according to example 1.

FIG. 5 shows the characteristic transfer line of the same transistor in the linear range (small $V_{DS}$), here there is observed a rise in the sub-threshold slope ($\Delta I_D/\Delta I_G$) with increasing drain voltage, accompanied by a reduction in leakage current, which can be attributed to successive filling of traps at the interface with mobile charge carriers. From $V_{DS}$=−7 V, this rise no longer changes, then the traps which are difficult to empty are filled and no longer play a part in the charge carrier dynamics. In addition it is recognised that the voltage $V_0$, which is required in order to move the transistor into the off state ($I_{off}$=1E−9), adopts relatively high positive values of $V_0$=24 V. The transistor is therefore normally on. The ratio of on to off current is $10^4$-$10^5$. Between forward and reverse measurement, the hysteresis is approx. 3 V, which implies an equally large shift in the operating voltage.

Figure 7:
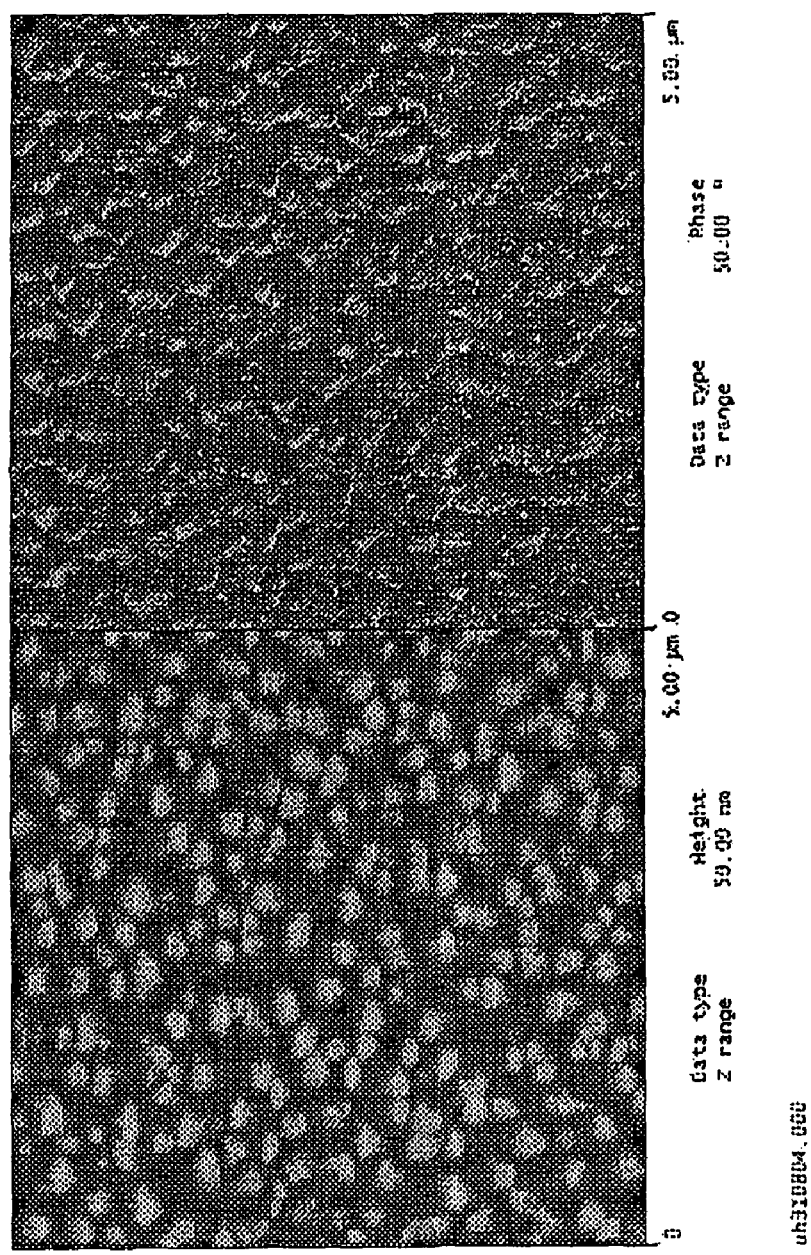
FIG. 7 shows a scanning force micrograph of the semiconductor component according to example 2, the surface of the organic semiconductor pentacene being illustrated.

From the transfer characteristic line in the linear range, the transconductance $g_m$ can be determined according to $$g_m = \partial I_D/\partial V_G = W/L \cdot C_i \mu_{eff} V_D$$

and the charge carrier mobility $\mu_{eff}$ can be determined therefrom. W designates the width, L the length of the active channel and $C_i$ the surface-specific capacity of the dielectric. In FIG. 7, the dependency of the charge carrier mobility upon the gate voltage is represented. There is detected a linear rise in mobility, which is typical of organic dielectrics, with the gate voltage and a type of saturation at $V_{GS}$>−25 V which can be attributed to a current delimitation based on the contact resistance. The maximum, effective mobility is between 0.2 cm$^2$/Vs<$\mu_{eff}$<0.25 cm$^2$/Vs. Improved engineering of the contacts could reduce or prevent the saturation of $\mu_{eff}$ so that the current levels to be achieved increase significantly at $V_{GS}$>−25 V.

EXAMPLE 2

2.1 Resin Synthesis and Characteristics (EL20)

The production of hybrid polymer system 2 (EL20) is effected according to the following scheme:

| 20% | by mol | diphenylsilanediol |
|---|---|---|
| 20% | by mol | dimethyldiethoxysilane |
| 1 | mol/Si—O-group | diethylcarbonate |
| 1% | by mol (relative to silanes) | NH$_4$F |
| 35% | by mol | epoxycyclohexylethyltrimethoxysilane |
| 25% | by mol | Memo NT |
| 50% | by stoich. | H$_2$O (relative to hydrolysis) |

In a 1 l three-neck flask, which is equipped with a cooler, a thermometer and a drop funnel, the first 4 components are weighed in the above sequence and agitated for 5 days at room temperature. The batch is clear to opaque. The remaining components are weighed in, the batch is firstly white to cloudy and clears within 6 hours. All the reactions are implemented at room temperature. After 2 d, the batch is rotated off (up to 13 mbar).

2.2 Substrate Production (Technology) and Characteristics

The hybrid polymer system 2 (EL20) is diluted with propylacetate in the ratio 1:1 (EL20: solvent). 1% photostarter, relative to EL20, are added to the diluted system. Irgacure® 369 (Ciba-Geigy) is used as photostarter. The diluted EL20 system is centrifuged onto a silicon wafer, which was cleaned in advance, at a rotational speed of 3000 rpm. The light exposure is implemented on a mask aligner. Before exposure, the exposure chamber is flushed for 1 min with nitrogen. The substrate is exposed with a mercury lamp spectrum for 30 s. The intensity is 20 mW/cm$^2$ measured at a wavelength of 405 nm. After the exposure, the substrate is heated again on a heating plate for 2 min at 110° C. and cooled to room temperature. If a mask is used during the exposure, the organically non-cross-linked EL20 system 1 can subsequently be developed for 30 s in a developer solution made of M-pentanone and isopropanol (1:1). The substrate is finally heated in an oven for three hours at 150° C.

With these process parameters, a layer thickness of approx. 500 nm is achieved. The surface energy of this layer can be determined at approx. 29 N/mm$^2$ according to Owens method with the help of a contact angle measurement (with water and ethyleneglycol).

2.3 Deposition of Small Molecules (Pentacene)

The starting material for the semiconductor layer is a fine-particulate powder from a commercial source which is pre-cleaned in a multistage sublimation and condensation process. The pre-cleaned powder is heated in a crucible or in a Knudsen cell until sublimation and the evaporating molecules condense on the non- or slightly heated surface of the substrate with the hybrid polymer system 2 (El20). The rms roughness of El20 is only 0.84 nm. Therefore a virtually atomically smooth surface is of concern here. In a precisely controlled deposition process (in parallel with El6), nominally 50 nm of the semiconductor are then applied very slowly at a deposition rate of approx. 0.1-0.3 nm/min. The substrate temperature is at 65° C., at a lower temperature (room temperature) the crystallites are somewhat smaller.

2.4 Characterisation of the Layers

The scanning force micrograph of 50 nm pentacene on El20 shows no dendritic, large crystallites, as with El6 but small, somewhat angular particles and a very large nucleation density (FIG. 7) although the roughness of El20 is far below that of El6. Solely the different surface chemistry corresponding to a different formulation of the hybrid polymer systems must be held to be responsible for poorer growth of pentacene.

Figure 8:
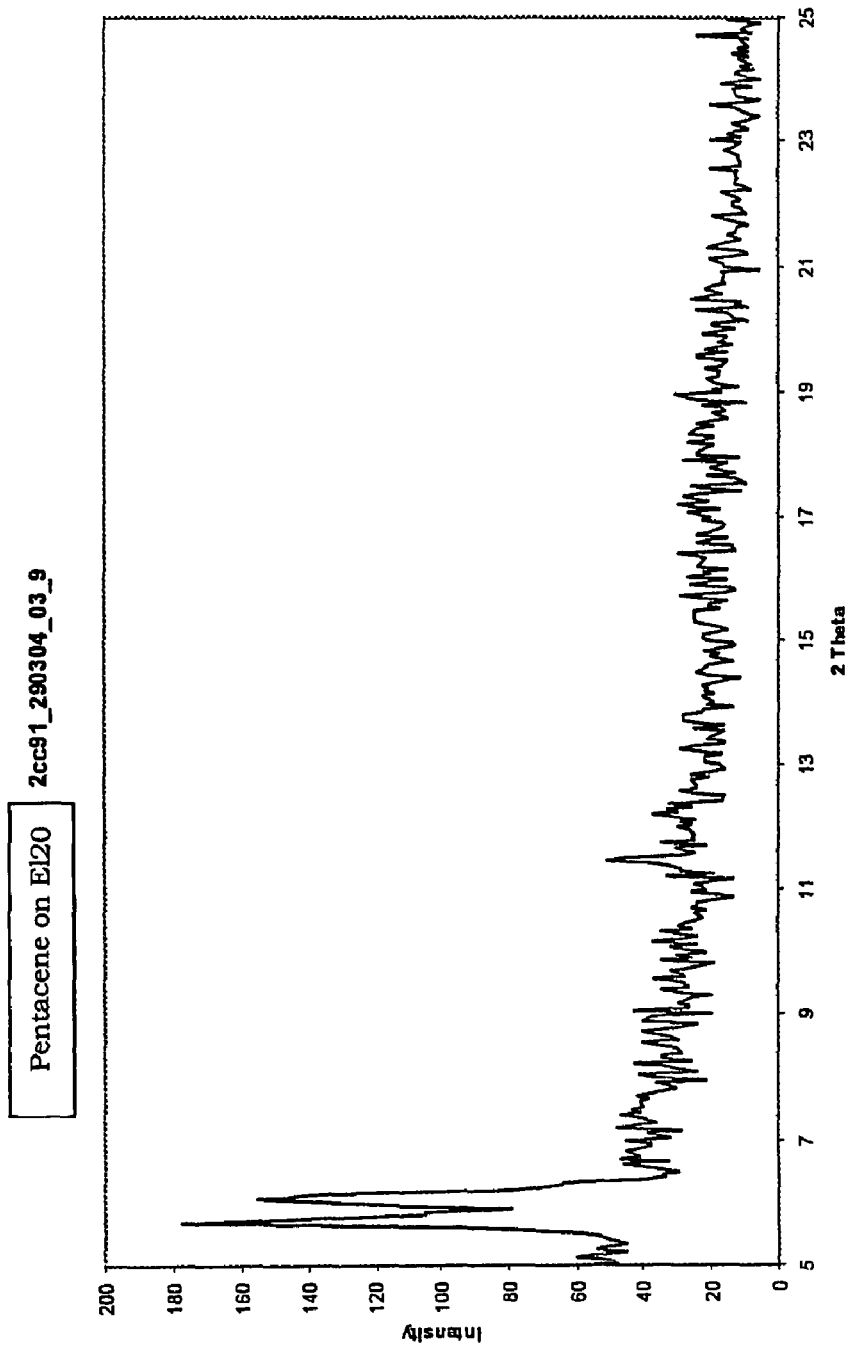
FIG. 8 shows a powder spectrum of a 50 nm pentacene layer of a semiconductor component according to example 2.

In the powder spectrum (FIG. 8), which was also made from this pentacene film, it is seen that the volume phase component ($2\Theta=6.1°$) increases significantly in comparison with the component of the thin film phase, because of the low order of the crystallites only the (001) reflection can be observed and the half-value width of the (001) reflections reduces, which correlates with the reduced crystallite size.

2.5 Production of TFTs and their Characterisation

From the silicon wafers coated with El20 and the condensed pentacene layer, a thin film transistor can be produced relatively easily in top contact configuration (FIG. 1a), in that Au is applied selectively via shadow masks by electron-beam or thermal evaporation and thus source and drain electrodes are produced. The wafer serves as gate electrode. El20T forms the gate dielectric.

The electrodes can also be applied below the pentacene layer (FIG. 1b, bottom contact) in a photolithographic or other structuring method and also other contact materials, such as for example conducting polymers (polyaniline) can be used. In a further sequence, in particular for the integration of different components, structuring of the gate electrode is also necessary. The reverse construction also offers application-specific advantages (FIG. 1c).

Figure 9:
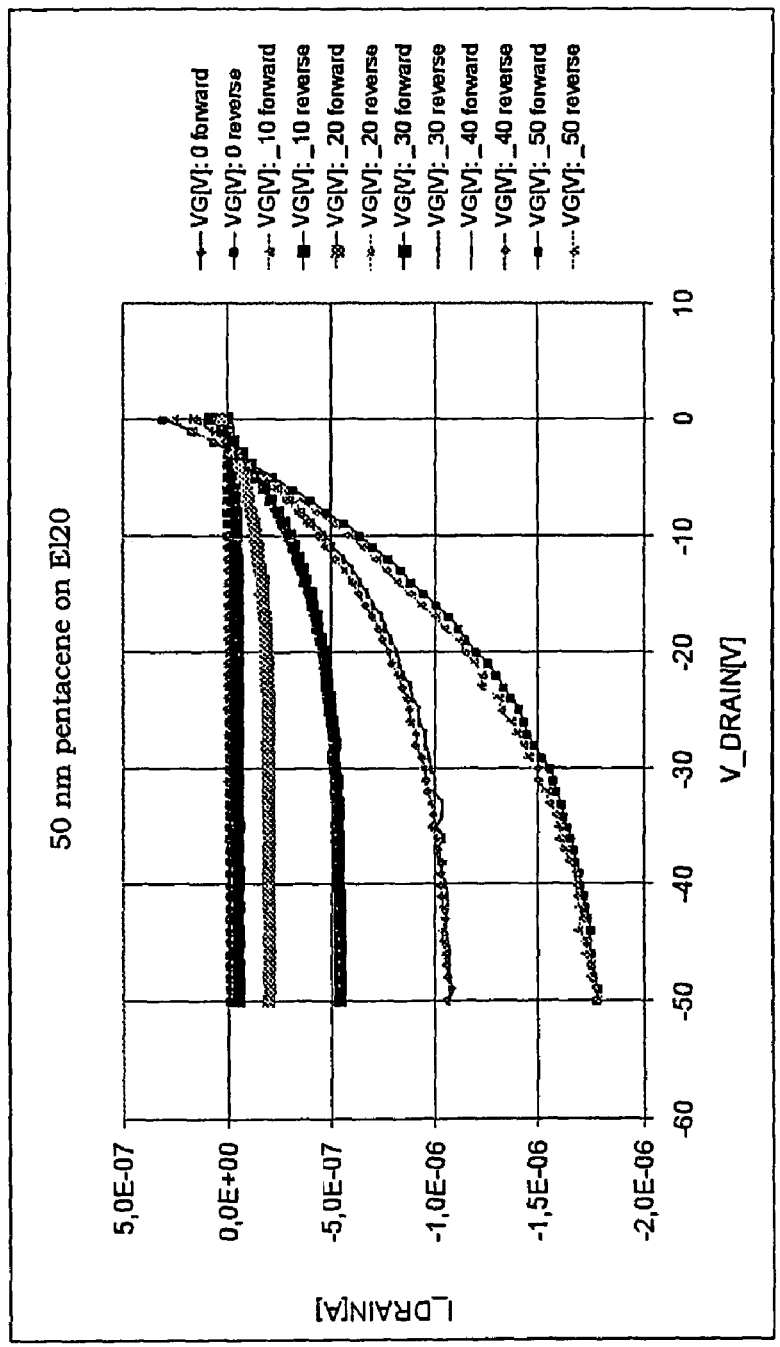
FIG. 9 shows, in a graphic illustration, the characteristic output line of a top contact semiconductor component according to example 2.

The electrical characterisation of the transistors with El20 as dielectric at the peak measuring place by means of a parameter analyser shows a significant field effect in the characteristic output line (FIG. 9). There is observed saturation of the drain current which is satisfactory for organic dielectrics, but also a leakage current which over the dielectric is not negligible in comparison with the drain current (the characteristic lines do not intersect at $V_{DS}=0$ V. As with El6, the hysteresis between the curves when rising (forward) and dropping (reverse) of the drain voltage is likewise rather small.

Figure 10:
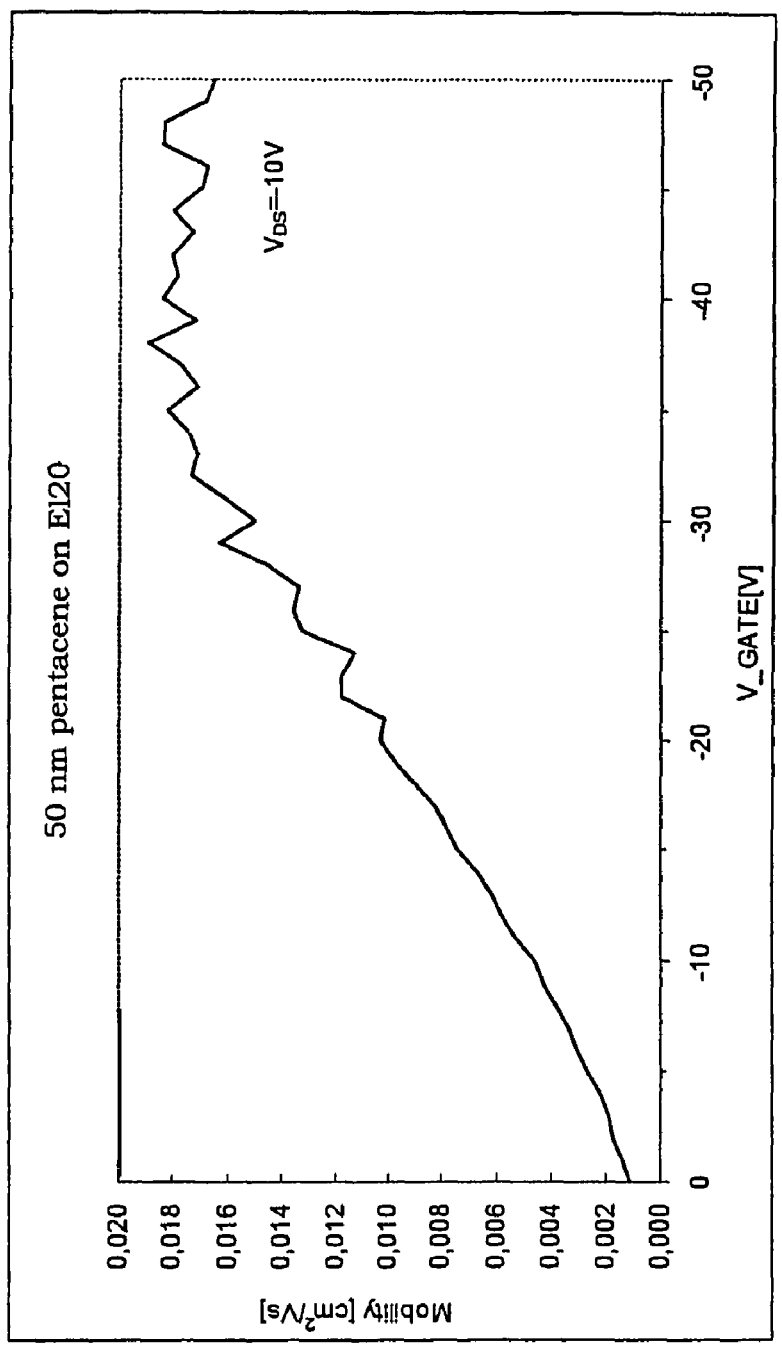
FIG. 10 shows, in a diagram, the gate voltage dependency of the charge carrier mobility of a top contact semiconductor component according to example 2.

In FIG. 10, the dependency of the charge carrier mobility upon the gate voltage is represented for this transistor. The mobility was determined similarly as with the El6 transistor via the transconductance. Also for the El20 transistor, the linear rise in mobility, which is typical of organic dielectrics, with the gate voltage is detected and a type of saturation at $V_{GS}>-25$ V, which can be attributed to a current delimitation due to the contact resistance. The maximum effective mobility is however smaller by an order of magnitude ($\mu_{eff}=0.02$ cm$^2$/Vs) than in example 1 (El6).

As the comparison of the transistors on El6 and El20 shows, there appears to be a correlation between particle size, polycrystalline degree of order and charge carrier mobility. The higher also the degree of order and the greater the crystallites, the higher also is the mobility of the holes and the better is the performance of the transistor. Also the increased bulk phase component could make a contribution to the reduction in mobility.

The invention claimed is:

1. A semi-conductor component having a metal-insulator structure (MIS), said semi-conductor component comprising: a substrate, a layer made of an organic semiconductor material, and a dielectric layer as insulator,
   wherein said substrate, said dielectric layer, or both said substrate and said dielectric layer comprise an organically modified silicic acid (hetero)polycondensate which can be obtained by:
   i) precondensation of
   a) 1 to 10% by mol of at least one silicon compound of formula I:

$$MR_4 \qquad (I)$$

wherein M is selected from silicon, zirconium, aluminum, and titanium, and R is a halogen, hydroxy, alkoxy, acyloxy, or a chelate ligand;
   b) 20 to 94% by mol of at least one organic silane of formula II:

$$R''_m(YR''')_nSiX_{(4-m-n)} \qquad (II)$$

wherein
   R'' is alkyl, aryl, alkylaryl, or arylalkyl,
   R''' is alkylene, alkenylene, arylene, alkylarylene, arylalkylene, alkenylarylene, or arylalkenylene,
   with R'' and R''' each optionally being interrupted by oxygen, sulphur or —NH—,
   X is hydrogen, halogen, hydroxy, alkoxy, acyloxy, or —NR'$_2$,
   R' is H or alkyl,
   Y is a polymerizable group,
   m is a whole number from 0 to 2,
   n is a whole number from 1 to 3,
   m+n is 1 to 3,
   c) 5 to 30% by mol of at least one organic silane of formula III $$R''_pSiX_{4-p} \qquad (III)$$

wherein R' and X have the meaning defined above, and p is 1, 2 or 3, and if necessary
   d) 0 to 10% by mol of at least one low volatile metal oxide, soluble in the reaction medium, of an element of groups Ia to Va or Vb, or of at least one compound, soluble in the reaction medium, of one of these elements which form a low volatile oxide;
   without external addition of water, if necessary in the presence of an organic solvent at a temperature between 0 and 90° C. during a time period between 0.5 and 48 hours, and
   (ii) hydrolysis condensation of the resultant precondensate with a stoichiometric quantity of water, at a temperature between 0 and 100° C. during a time period between 1 and 72 hours.

2. A semi-conductor component according to claim 1, wherein said substrate and said dielectric layer are formed from said organically modified silicic acid (hetero)polycondensate.

3. A semi-conductor component according to claim 1, wherein said substrate, said dielectric layer, or said substrate and said dielectric layer have a layer thickness of 1 nm to 1 µm.

4. A semi-conductor component according to claim 1, wherein said substrate is configured as a layer, the latter being disposed on an additional carrier structure.

5. A semi-conductor component according to claim 1, wherein said carrier structure is formed from an inorganic-organic hybrid polymer.

6. A semi-conductor component according to claim 1, wherein said carrier structure is selected from metals, semiconductors, substrates with oxidic surfaces, glasses, films, printed circuit boards (PCB), polymers, heterostructures, paper, textiles and/or composites thereof.

7. A semi-conductor component according to claim 1, wherein said organically modified silicic acid (hetero)polycondensate has a permittivity $\in_r < 3$.

8. A semi-conductor component according to claim 1, wherein said organically modified silicic acid (hetero)polycondensate has a permittivity $\in_r > 4$.

9. A semi-conductor component according to claim 1, wherein said organically modified silicic acid (hetero)polycondensate has a water vapor transmission rate (WVTR) of $10^{-3}$ to 30 g/m²d, relative to a layer thickness of 100 µm.

10. A semi-conductor component according to claim 1, wherein said organically modified silicic acid (hetero)polycondensate has a breakdown strength in the range of 50 to 400 V/µm.

11. A semi-conductor component according to claim 1, wherein said organically modified silicic acid (hetero)polycondensate is halogen-free.

12. A semi-conductor component according to claim 1, wherein said organically modified silicic acid (hetero)polycondensate is transparent.

13. A semi-conductor component according to claim 1, wherein said organically modified silicic acid (hetero)polycondensate is resistant to chemicals and solvents used in semiconductor electronics.

14. A semi-conductor component according to claim 1, further comprising a source electrode, a drain electrode, and a gate electrode.

15. A semi-conductor component according to claim 1, wherein said organic semiconductor material is selected from pentacene, poly(3-hexylthiophene) (P3HT), poly(p-phenylenevinylene) (PPV), polyamide (PA), polyacrylamide (PAA) and phthalocyanines.

16. In a method of producing a semiconductor component comprising providing a substrate, a layer made of an organic semiconductor material, and a dielectric layer as insulator, the improvement wherein said substrate, said dielectric layer, or both said substrate and said dielectric layer comprise an organically modified silicic acid (hetero)polycondensate which can be obtained by:
   i) precondensation of
   a) 1 to 10% by mol of at least one silicon compound of formula I:

$$MR_4 \quad (I)$$

wherein M is selected from silicon, zirconium, aluminum, and titanium, and R is a halogen, hydroxy, alkoxy, acyloxy, or a chelate ligand;
   b) 20 to 94% by mol of at least one organic silane of formula II:

$$R''_m(YR''')_nSiX_{(4-m-n)} \quad (II)$$

wherein
   R" is alkyl, aryl, alkylaryl, or arylalkyl,
   R"' is alkylene, alkenylene, arylene, alkylarylene, arylalkylene, alkenylarylene, or arylalkenylene,
   with R" and R"' each optionally being interrupted by oxygen, sulphur or —NH—,
   X is hydrogen, halogen, hydroxy, alkoxy, acyloxy, or —NR'₂,
   R' is H or alkyl,
   Y is a polymerizable group,
   m is a whole number from 0 to 2,
   n is a whole number from 1 to 3,
   m+n is 1 to 3,
   c) 5 to 30% by mol of at least one organic silane of formula III $$R''_pSiX_{4-p} \quad (III)$$

wherein R' and X have the meaning defined above, and p is 1, 2 or 3, and if necessary
   d) 0 to 10% by mol of at least one low volatile metal oxide, soluble in the reaction medium, of an element of groups Ia to Va or Vb, or of at least one compound, soluble in the reaction medium, of one of these elements which form a low volatile oxide;
   without external addition of water, if necessary in the presence of an organic solvent at a temperature between 0 and 90° C. during a time period between 0.5 and 48 hours, and
   (ii) hydrolysis condensation of the resultant precondensate with the stoichiometric quantity of water, at a temperature between 0 and 100° C. during a time period between 1 and 72 hours.

17. A method according to claim 16, wherein said organically modified silicic acid (hetero)polycondensate is used as said substrate, and said substrate is used for crystalline growth of small molecules.

18. A method according to claim 16, wherein said organically modified silicic acid (hetero)polycondensate is used as said substrate, and said substrate is used for ordered application of organic semiconductor layers.

19. A method according to claim 16, wherein said organically modified silicic acid (hetero)polycondensate is used as said dielectric layer.

20. A method according to claim 16, wherein said organically modified silicic acid (hetero)polycondensate has a permittivity $\in r < 3$.

21. A method according to claim 16, wherein said organically modified silicic acid (hetero)polycondensate has a permittivity $\in_r > 4$.

22. A method according to claim 16, wherein said organically modified silicic acid (hetero)polycondensate has a water vapor transmission rate (WVTR) of $10^{-3}$ to 30 g/m²d, relative to a layer thickness of 100 µm.

23. A method according to claim 16, wherein said organically modified silicic acid (hetero)polycondensate has a breakdown strength in the range of 50 to 400 V/µm.

24. A method according to claim 16, wherein said organically modified silicic acid (hetero)polycondensate is halogen-free.

25. A method according to claim 16, wherein said organically modified silicic acid (hetero)polycondensate is transparent.

26. A method according to claim 16, wherein said organically modified silicic acid (hetero)polycondensate is resistant to chemicals and solvents used in semiconductor electronics.

27. A semi-conductor component according to claim 3, wherein said substrate, said dielectric layer, or both said substrate and said dielectric layer has a layer thickness of 1 nm to 100 nm.

28. A semi-conductor component according to claim 9, wherein said organically modified silicic acid (hetero)polycondensate has a water vapor transmission rate (WVTR) of 0.1 to 3 $g/m^2 d$ respectively relative to a layer thickness of 100 µm.

* * * * *